United States Patent
Kawasaki

(10) Patent No.: US 10,553,500 B2
(45) Date of Patent: Feb. 4, 2020

(54) METHOD OF MANUFACTURING SEMICONDUCTOR APPARATUS

(71) Applicant: Mitsubishi Electric Corporation, Tokyo (JP)

(72) Inventor: Yuji Kawasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/772,102

(22) PCT Filed: Mar. 1, 2016

(86) PCT No.: PCT/JP2016/056271
§ 371 (c)(1),
(2) Date: Apr. 30, 2018

(87) PCT Pub. No.: WO2017/149662
PCT Pub. Date: Sep. 8, 2017

(65) Prior Publication Data
US 2018/0315669 A1 Nov. 1, 2018

(51) Int. Cl.
*H01L 21/66* (2006.01)
*H01L 21/78* (2006.01)

(52) U.S. Cl.
CPC .............. *H01L 22/12* (2013.01); *H01L 21/78* (2013.01); *H01L 22/30* (2013.01)

(58) Field of Classification Search
CPC .................... H01L 22/12; H01L 22/30; H01L 21/78–8249
See application file for complete search history.

(56) References Cited

U.S. PATENT DOCUMENTS

| 2014/0183693 | A1* | 7/2014 | Tsai | H01L 23/48 257/532 |
| 2017/0103925 | A1* | 4/2017 | Jhon | H01L 22/20 |
| 2017/0222013 | A1* | 8/2017 | Makiyama | H01L 21/31144 |

FOREIGN PATENT DOCUMENTS

| JP | H06-204101 A | 7/1994 |
| JP | 2002-083792 A | 3/2002 |
| JP | 2003-051470 A | 2/2003 |
| JP | 2007-329248 A | 12/2007 |
| JP | 2010-287845 A | 12/2010 |

OTHER PUBLICATIONS

Translation of the International Preliminary Report on Patentability issued in corresponding International Application No. PCT/JP2016/056271; dated Sep. 13, 2018.
(Continued)

*Primary Examiner* — Sonya D. McCall-Shepard
(74) *Attorney, Agent, or Firm* — Studebaker & Brackett PC

(57) ABSTRACT

A plurality of semiconductor devices (5) are formed on a semiconductor wafer (1). A film thickness measurement wiring pattern (3,4) is formed on a dicing line (6,7) defining the plurality of semiconductor devices (5). An SOG film (10) is formed on the semiconductor devices (5) and the film thickness measurement wiring pattern (3,4). A film thickness of the SOG film (10) at a central part of the film thickness measurement wiring pattern (3,4) is measured. The film thickness measurement wiring pattern (3,4) is a rectangular pattern having long sides parallel to the dicing line (3,4).

9 Claims, 5 Drawing Sheets

(56) References Cited

OTHER PUBLICATIONS

International Search Report issued in PCT/JP2016/056271; dated May 17, 2016.
Written Opinion issued in PCT/JP2016/056271; dated May 17, 2016.
Notification of Transmittal of the International Search Report and the Written Opinion of the International Searching Authority, or the Declaration issued in PCT/JP2016/056271; dated May 17, 2016.
An Office Action; "Notice of Reasons for Refusal," issued by the Japanese Patent Office dated Mar. 5, 2019, which corresponds to Japanese Patent Application No. 2018-502911 and is related to U.S. Appl. No. 15/772,102; with English language translation.
An Office Action issued by the Japanese Patent Office dated May 21, 2019, which corresponds to Japanese Patent Application No. 2018-502911 and is related to U.S. Appl. No. 15/772,102; with English language translation.

* cited by examiner

METHOD OF MANUFACTURING SEMICONDUCTOR APPARATUS

FIELD

The present invention relates to a method of manufacturing a semiconductor apparatus that forms an SOG film.

BACKGROUND

One of wafer process steps for manufacturing a semiconductor apparatus is an SOG (spin on glass) film formation step (e.g., see PTL 1). An SOG film is mainly used to reduce height differences of inter-layer insulating films formed on a wiring or embed inter-wire grooves. The SOG film has viscosity, and is applied while rotating a silicon wafer and formed by further rotating the silicon wafer after the application to adjust the film thickness. For quality management of the wafer process step, it is necessary to measure the film thickness of the SOG film.

The film thickness measurement of the SOG film is performed by calculating different light reflection factors of the wiring and the SOG film and measuring the film thickness of the SOG film on the wiring. A film thickness measurement wiring pattern is normally placed not in a chip but on a dicing line. A dicing line width needs to be kept to a minimum necessary for increasing the number of chips taken per wafer and increasing productivity.

CITATION LIST

Patent Literature

[PTL 1] JP 2007-329248 A

SUMMARY

Technical Problem

The film thickness of the SOG film is measured at a central part of a wiring pattern. However, the SOG film is moved to outside the pattern by a centrifugal force caused by rotation of a wafer when the SOG film is formed and the SOG film at a film thickness measurement point at the central part of the pattern is thinned. The central part of the wafer where the centrifugal force is weak becomes thick because the SOG film moves relatively less, whereas peripheral portions of the wafer where the centrifugal force is strong become thin because the SOG film moves more. For this reason, there is a problem that the SOG film has wafer in-plane dependency with the film thickness forming a concentric shape, making it impossible to stably measure the film thickness.

The present invention has been implemented to solve the aforementioned problem and it is an object of the present invention to provide a method of manufacturing a semiconductor apparatus that can stably measure a film thickness.

Solution to Problem

A method of manufacturing a semiconductor apparatus according to the present invention includes: forming a plurality of semiconductor devices on a semiconductor wafer, forming a film thickness measurement wiring pattern on a dicing line defining the plurality of semiconductor devices; forming an SOG film on the semiconductor devices and the film thickness measurement wiring pattern; and measuring a film thickness of the SOG film at a central part of the film thickness measurement wiring pattern, wherein the film thickness measurement wiring pattern is a rectangular pattern having long sides parallel to the dicing line.

Advantageous Effects of Invention

In the present invention, the film thickness measurement wiring pattern is a rectangular pattern having long sides parallel to the dicing line. Thus, as it is possible to suppress a reduction of film thickness in the longitudinal direction of the pattern, it is possible to stably measure the film thickness of the SOG film.

DESCRIPTION OF EMBODIMENTS

A method of manufacturing a semiconductor apparatus according to the embodiments of the present invention will be described with reference to the drawings. The same components will be denoted by the same symbols, and the repeated description thereof may be omitted.

Embodiment 1.

Figure 1:
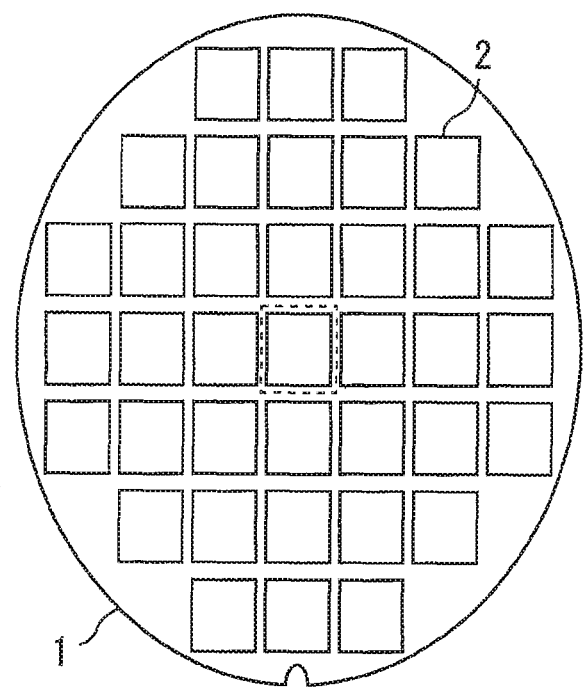
FIG. 1 is a plan view illustrating a semiconductor wafer according to Embodiment 1 of the present invention.
Figure 2:
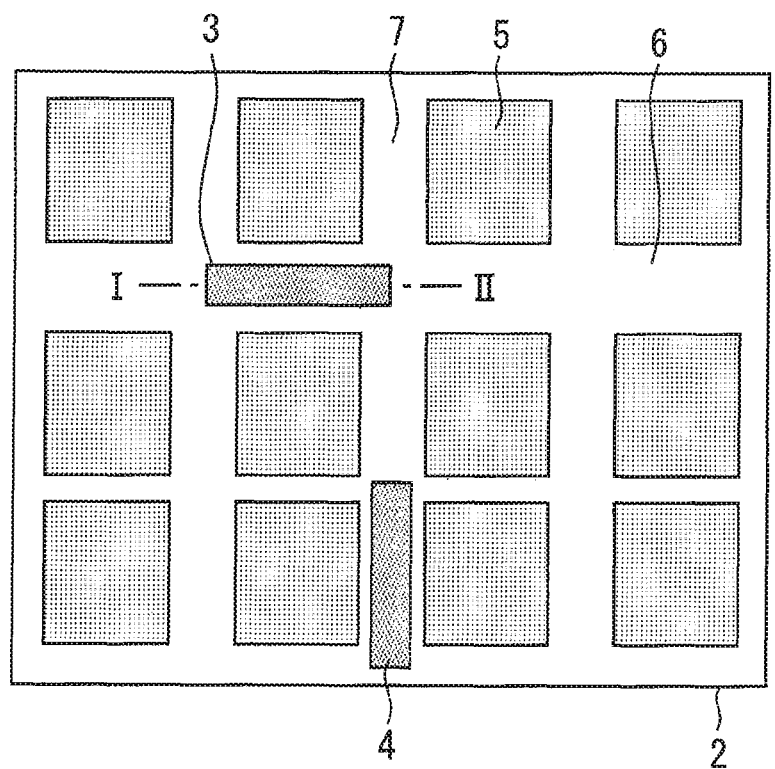
FIG. 2 is an enlarged plan view of one shot enclosed by a broken line in FIG. 1.
Figure 3:
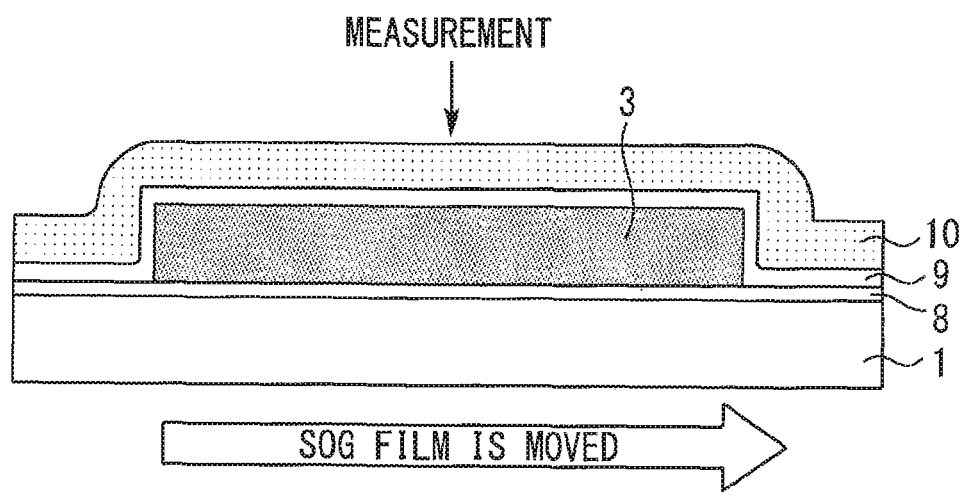
FIG. 3 is a cross-sectional view along I-II in FIG. 2.

FIG. 1 is a plan view illustrating a semiconductor wafer according to Embodiment 1 of the present invention. A plurality of shots 2 are arranged in a matrix form on a semiconductor wafer 1. FIG. 2 is an enlarged plan view of one shot enclosed by a broken line in FIG. 1. Configurations of the other shots 2 in FIG. 1 are also similar to the configuration in FIG. 2. FIG. 3 is a cross-sectional view along I-II in FIG. 2. FIG. 3 illustrates a cross section of a first film thickness measurement wiring pattern 3 and the same applies to a cross section of a second film thickness measurement wiring pattern 4. A method of manufacturing a semiconductor apparatus according to the present embodiment will be described with reference to these drawings.

First, a plurality of semiconductor devices 5 are formed on the semiconductor wafer 1. Here, first and second dicing lines 6 and 7 which are orthogonal to each other define a plurality of semiconductor devices 5. Next, a first inter-layer insulating film 8 is formed on the semiconductor wafer 1. Next, the first and second film thickness measurement wiring patterns 3 and 4 made of metal or the like are formed on the first and second dicing lines 6 and 7 respectively through film formation and machining steps.

Next, a second inter-layer insulating film 9 and an SOG film 10 are formed in that order on the semiconductor device 5 and the first and second film thickness measurement wiring patterns 3 and 4. Next, different light reflection factors of the first and second film thickness measurement wiring patterns 3 and 4 and the SOG film 10 are calculated. Film thicknesses of the SOG films 10 at central parts of the first and second film thickness measurement wiring patterns 3 and 4 are measured respectively. After that, through steps such as cleavage along the first and second dicing lines 6 and 7, the semiconductor apparatus of the present embodiment is manufactured.

Figure 4:
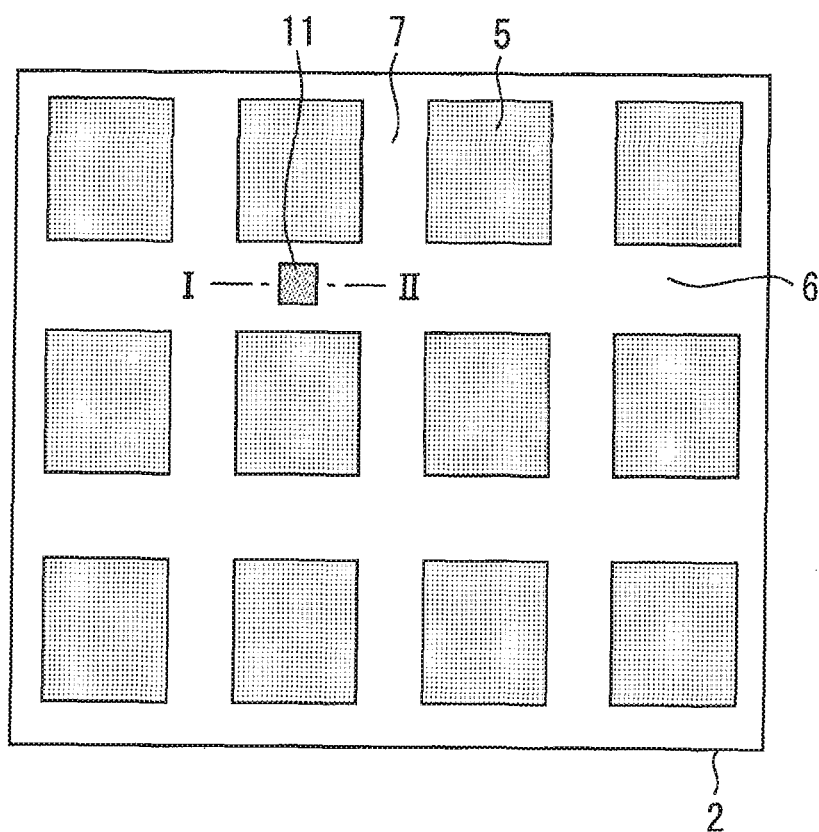
FIG. 4 is an enlarged plan view of one shot of a semiconductor wafer according to the comparative example.
Figure 5:
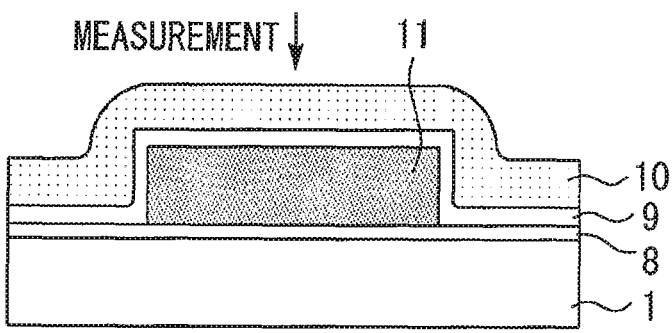
FIG. 5 is a cross-sectional view along I-II of FIG. 4.
Figure 6:
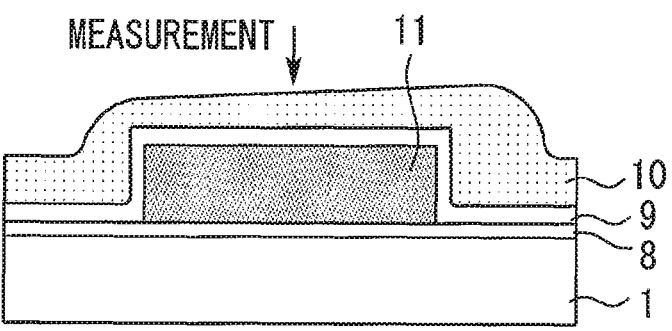
FIG. 6 is a cross-sectional view illustrating a situation in which a centrifugal force is applied in the comparative example.
Figure 7:
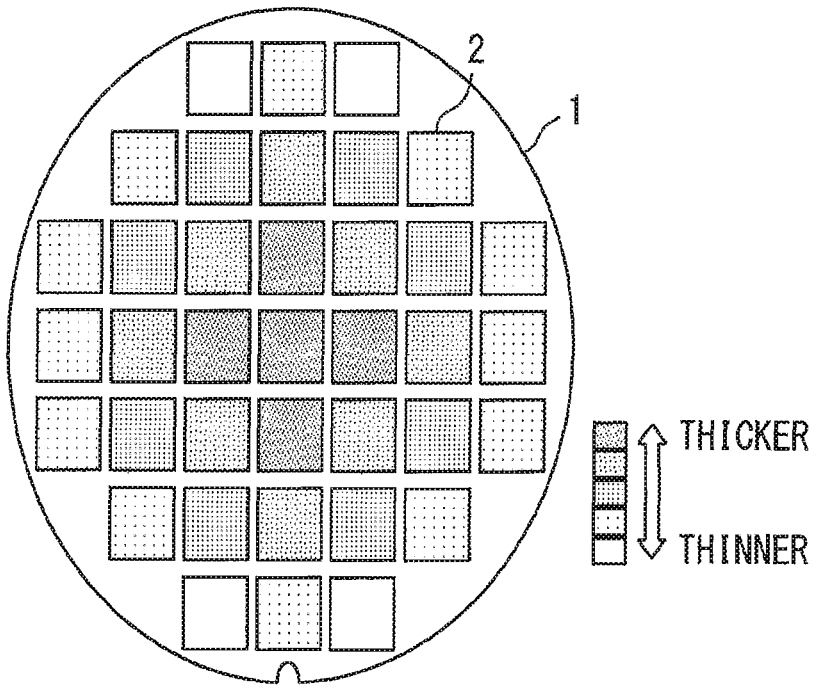
FIG. 7 is a plan view illustrating a film thickness in-plane tendency of the SOG film at the central part of the film thickness measurement wiring pattern in the comparative example.

Next, the method of measuring a film thickness according to the present embodiment will be described in further detail in comparison with a comparative example. FIG. 4 is an enlarged plan view of one shot of a semiconductor wafer according to the comparative example. FIG. 5 is a cross-sectional view along I-II of FIG. 4. In the comparative example, a film thickness measurement wiring pattern 11 is a square pattern. FIG. 6 is a cross-sectional view illustrating a situation in which a centrifugal force is applied in the comparative example. The SOG film 10 is moved to outside the pattern by a centrifugal force caused by rotation of the wafer at the time of film formation and the SOG film 10 at a film thickness measurement point at a central part of the pattern is thinned. FIG. 7 is a plan view illustrating a film thickness in-plane tendency of the SOG film at the central part of the film thickness measurement wiring pattern 11 in the comparative example. At the central part of the wafer where the centrifugal force is weak, the SOG film 10 moves relatively less and the thickness of the SOG film 10 increases, whereas at peripheral portions of the wafer where the centrifugal force is strong, the SOG film 10 moves widely and the thickness of the SOG film 10 decreases.

In contrast, the first and second film thickness measurement wiring patterns 3 and 4 in the present embodiment are rectangular patterns, the long sides of which are parallel to the first and second dicing lines 6 and 7 respectively. Since the length in the longitudinal direction of the wiring pattern is sufficiently large, an absolute amount of the SOG film 10 on the wiring pattern increases and an amount of the SOG film 10 remaining on the wiring pattern increases relative to an amount of the SOG film 10 flowing to outside the wiring pattern along the longitudinal direction due to the centrifugal force. For this reason, it is possible to suppress a reduction of film thickness in the longitudinal direction of the pattern.

Figure 8:
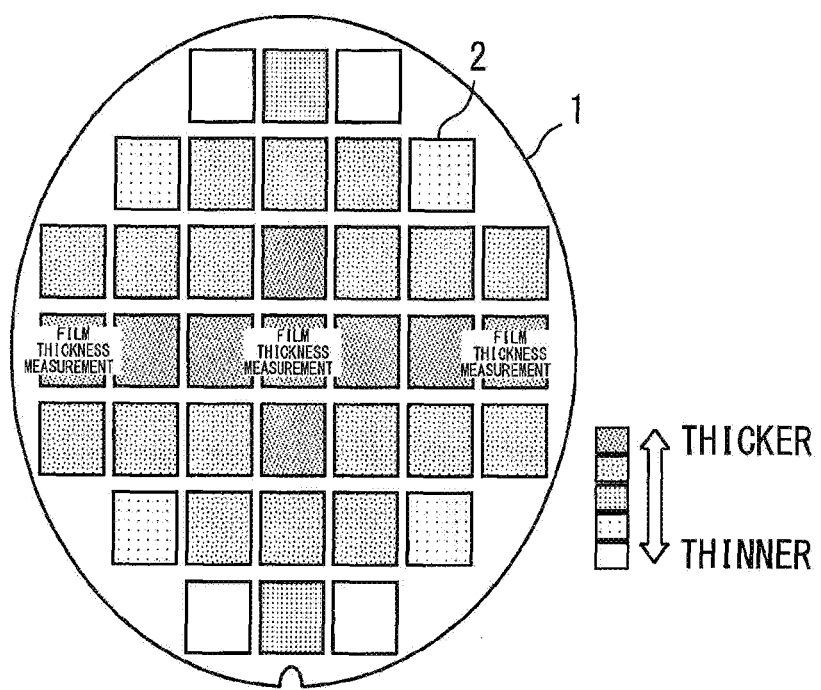
FIG. 8 is a plan view illustrating a film thickness in-plane tendency of the SOG film at a central part of the first film thickness measurement wiring pattern according to Embodiment 1 of the present invention.
Figure 9:
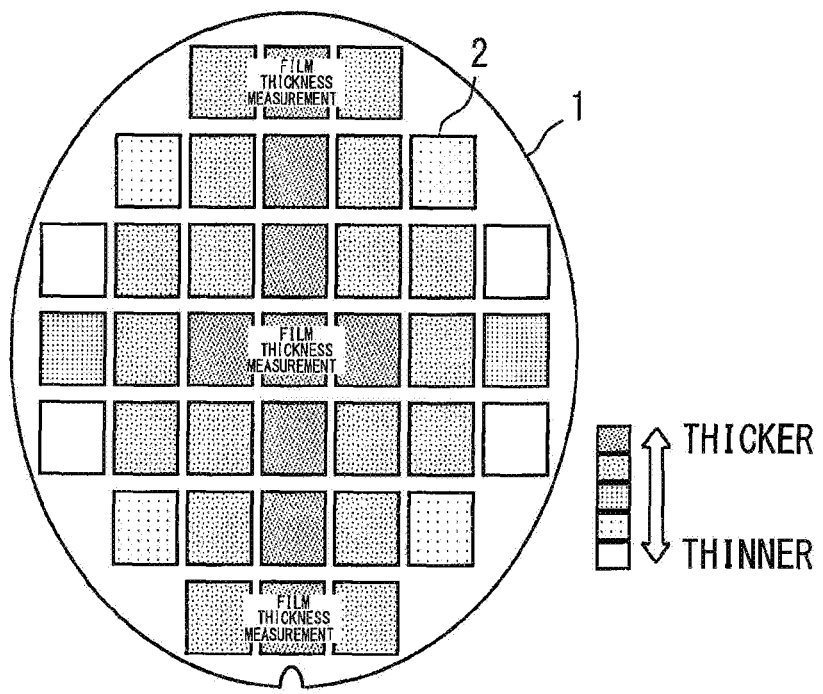
FIG. 9 is a plan view illustrating a film thickness in-plane tendency of the SOG film at a central part of the second film thickness measurement wiring pattern according to Embodiment 1 of the present invention.

FIG. 8 is a plan view illustrating a film thickness in-plane tendency of the SOG film at a central part of the first film thickness measurement wiring pattern according to Embodiment 1 of the present invention. The thicknesses of the SOG film 10 at central parts of the first film thickness measurement wiring patterns 3 increase in directions of 3 o'clock and 9 o'clock parallel to the first dicing line 6 from the central part of the semiconductor wafer 1. FIG. 9 is a plan view illustrating a film thickness in-plane tendency of the SOG film at a central part of the second film thickness measurement wiring pattern according to Embodiment 1 of the present invention. The thickness of the SOG film 10 at a central part of the second film thickness measurement wiring pattern 4 increases in directions of 12 o'clock and 6 o'clock parallel to the second dicing line 7 from the central part of the semiconductor wafer 1. The thickness of the SOG film 10 does not decrease in these regions, but becomes uniform with respect to the thickness at the central part of the semiconductor wafer 1.

Therefore, in the present embodiment, the film thicknesses of the SOG film 10 on the first film thickness measurement wiring pattern 3 are measured at a central part of the semiconductor wafer 1 and at peripheral portions of the semiconductor wafer 1 located in the directions of 3 o'clock and 9 o'clock. Then, the film thicknesses of the SOG film 10 on the second film thickness measurement wiring pattern 4 are measured at a central part of the semiconductor wafer 1 and at the peripheral portions of the semiconductor wafer 1 located in the directions of 12 o'clock and 6 o'clock. In this way, it is possible to stably measure the film thickness of the SOG film 10 at five in-plane points: the central part of the semiconductor wafer 1, the peripheral portions in the directions of 12 o'clock, 3 o'clock, 6 o'clock and 9 o'clock.

Embodiment 2.

Figure 10:
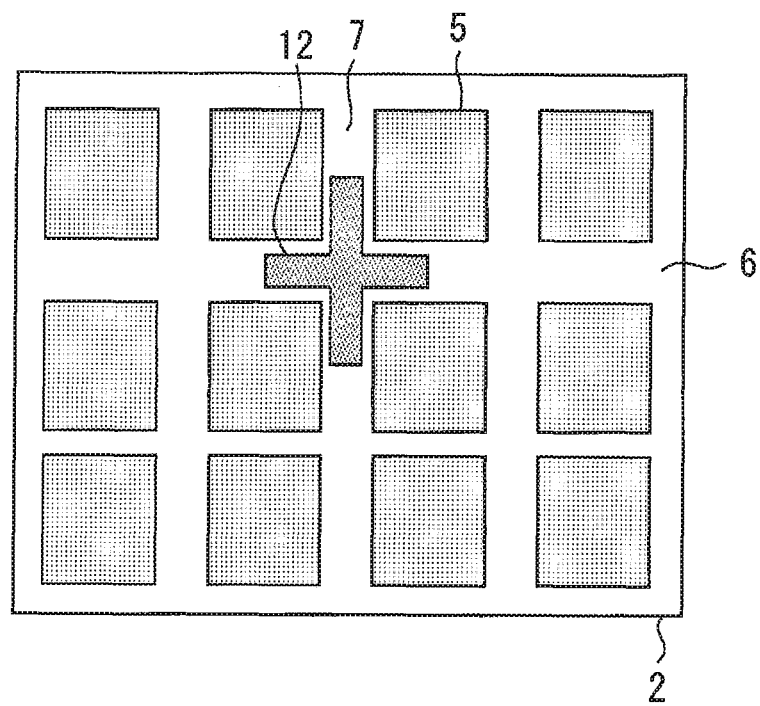
FIG. 10 is an enlarged plan view of one shot of a semiconductor wafer according to Embodiment 2 of the present invention.

FIG. 10 is an enlarged plan view of one shot of a semiconductor wafer according to Embodiment 2 of the present invention. In the present embodiment, a film thickness measurement wiring pattern 12 is a cross-like pattern positioned in a region where the first and second dicing lines 6 and 7 cross each other.

Figure 11:
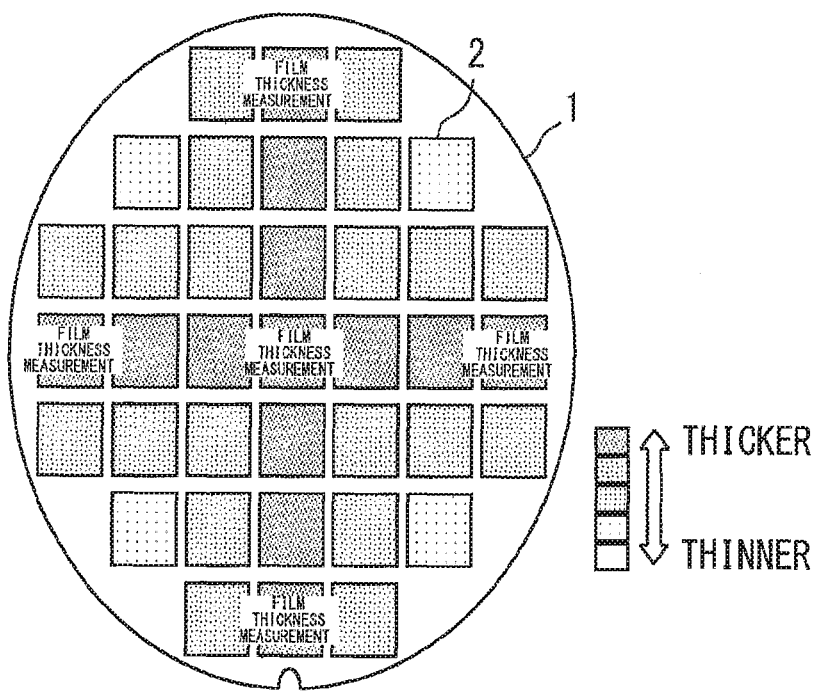
FIG. 11 is a plan view illustrating a film thickness in-plane tendency of an SOG film at a central part of the film thickness measurement wiring pattern according to Embodiment 2 of the present invention.

FIG. 11 is a plan view illustrating a film thickness in-plane tendency of an SOG film at a central part of the film thickness measurement wiring pattern according to Embodiment 2 of the present invention. The thicknesses of the SOG film 10 increase at central parts of the film thickness measurement wiring patterns 12 in the directions of 12 o'clock and 6 o'clock and in the directions of 3 o'clock and 9 o'clock. The thicknesses of the SOG film 10 do not decrease in these regions, but become uniform with respect to the thickness at the central part of the semiconductor wafer 1.

Therefore, in the present embodiment, the film thicknesses of the SOG film 10 on the film thickness measurement wiring patterns 12 are measured at the central part of the semiconductor wafer 1, at the peripheral portions of the semiconductor wafer 1 located in the directions of 12 o'clock and 6 o'clock and at the peripheral portions of the semiconductor wafer 1 located in the directions of 3 o'clock and 9 o'clock. In this way, it is possible to stably measure the film thicknesses of the SOG film 10 at five in-plane points: the central part of the semiconductor wafer 1, the peripheral portions in the directions of 12 o'clock, 3 o'clock, 6 o'clock and 9 o'clock. Furthermore, since these film thicknesses can be measured in single measurement, steps can be simplified.

The semiconductor wafer 1 is not limited to a wafer formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 semiconductor wafer; 5 semiconductor device; 6,7 dicing line; 3,4,12 film thickness measurement wiring pattern; 10 SOG film

The invention claimed is:
1. A method of manufacturing a semiconductor apparatus comprising:
   forming a plurality of semiconductor devices on a semiconductor wafer;
   forming a film thickness measurement wiring pattern on a dicing line defining the plurality of semiconductor devices;
   forming an SOG film on the semiconductor devices and the film thickness measurement wiring pattern; and
   measuring a film thickness of the SOG film at a central part of the film thickness measurement wiring pattern, wherein
   the film thickness measurement wiring pattern includes a first film thickness measurement wiring pattern having long sides parallel to the first dicing line and a second film thickness measurement wiring pattern having long sides parallel to the second dicing line, and
   the film thickness measurement wiring pattern is a cross-like pattern positioned in a region where the first and second dicing lines cross each other.

2. The method of manufacturing a semiconductor apparatus according to claim 1, wherein film thicknesses of the SOG film on the film thickness measurement wiring pattern are measured at a central part of the semiconductor wafer, at a peripheral portion of the semiconductor wafer located in a direction parallel to the first dicing line from the central part of the semiconductor wafer, and at a peripheral portion of the semiconductor wafer located in a direction parallel to the second dicing line from the central part of the semiconductor wafer.

3. A method of manufacturing a semiconductor apparatus comprising:
   forming a plurality of semiconductor devices on a semiconductor wafer;
   forming a film thickness measurement wiring pattern on a dicing line defining the plurality of semiconductor devices;
   forming an SOG film on the semiconductor devices and the film thickness measurement wiring pattern; and
   measuring a film thickness of the SOG film at a central part of the film thickness measurement wiring pattern, wherein
   the film thickness measurement wiring pattern is a rectangular pattern having long sides parallel to the dicing line,
   the dicing line includes first and second dicing lines orthogonal to each other,
   the film thickness measurement wiring pattern includes a first film thickness measurement wiring pattern having long sides parallel to the first dicing line and a second film thickness measurement wiring pattern having long sides parallel to the second dicing line,
   film thicknesses of the SOG film at central parts of the first and second film thickness measurement wiring patterns are measured respectively,
   the long sides of the film thickness measurement wiring pattern having a length that is longer than a length of at least one of each of the plurality of semiconductor devices,
   film thicknesses of the SOG film on the first film thickness measurement wiring pattern are measured at a central part of the semiconductor wafer and at a peripheral portion of the semiconductor wafer located in a direction parallel to the first dicing line from the central part of the semiconductor wafer, and
   film thicknesses of the SOG film on the second film thickness measurement wiring pattern are measured at a central part of the semiconductor wafer and at a peripheral portion of the semiconductor wafer located in a direction parallel to the second dicing line from the central part of the semiconductor wafer.

4. A method of manufacturing a semiconductor apparatus comprising:
   forming a plurality of semiconductor devices on a semiconductor wafer;
   forming a film thickness measurement wiring pattern on a dicing line defining the plurality of semiconductor devices;
   forming an SOG film on the semiconductor devices and the film thickness measurement wiring pattern; and
   measuring a film thickness of the SOG film at a central part of the film thickness measurement wiring pattern, wherein
   the film thickness measurement wiring pattern is a rectangular pattern having long sides parallel to the dicing line, and
   the long sides of the film thickness measurement wiring pattern having a length that is longer than a length of at least one of each of the plurality of semiconductor devices.

5. The method of manufacturing a semiconductor apparatus according to claim 4, wherein
   the dicing line includes first and second dicing lines orthogonal to each other,
   the film thickness measurement wiring pattern includes a first film thickness measurement wiring pattern having long sides parallel to the first dicing line and a second film thickness measurement wiring pattern having long sides parallel to the second dicing line, and
   film thicknesses of the SOG film at central parts of the first and second film thickness measurement wiring patterns are measured respectively.

6. The method of manufacturing a semiconductor apparatus according to claim 5, wherein
   film thicknesses of the SOG film on the first film thickness measurement wiring pattern are measured at a central part of the semiconductor wafer and at a peripheral portion of the semiconductor wafer located in a direction parallel to the first dicing line from the central part of the semiconductor wafer, and
   film thicknesses of the SOG film on the second film thickness measurement wiring pattern are measured at a central part of the semiconductor wafer and at a peripheral portion of the semiconductor wafer located in a direction parallel to the second dicing line from the central part of the semiconductor wafer.

7. A method of manufacturing a semiconductor apparatus comprising:
   forming a plurality of semiconductor devices on a semiconductor wafer;

forming a film thickness measurement wiring pattern on a dicing line defining the plurality of semiconductor devices;

forming an SOG film on the semiconductor devices and the film thickness measurement wiring pattern; and measuring a film thickness of the SOG film at a central part of the film thickness measurement wiring pattern, wherein the film thickness measurement wiring pattern is a rectangular pattern having long sides parallel to the dicing line, the forming an SOG film includes applying an SOG film on the semiconductor devices and the film thickness measurement wiring pattern while rotating the semiconductor wafer, the long sides of the film thickness measurement wiring pattern having a length that is longer than a length of at least one of each of the plurality of semiconductor devices, film thicknesses of the SOG film on the first film thickness measurement wiring pattern are measured at a central part of the semiconductor wafer and at a peripheral portion of the semiconductor wafer located in a direction parallel to the first dicing line from the central part of the semiconductor wafer, and film thicknesses of the SOG film on the second film thickness measurement wiring pattern are measured at a central part of the semiconductor wafer and at a peripheral portion of the semiconductor wafer located in a direction parallel to the second dicing line from the central part of the semiconductor wafer.

8. The method of manufacturing a semiconductor apparatus according to claim 7, wherein the dicing line includes first and second dicing lines orthogonal to each other, the film thickness measurement wiring pattern includes a first film thickness measurement wiring pattern having long sides parallel to the first dicing line and a second film thickness measurement wiring pattern having long sides parallel to the second dicing line, and film thicknesses of the SOG film at central parts of the first and second film thickness measurement wiring patterns are measured respectively.

9. The method of manufacturing a semiconductor apparatus according to claim 8, wherein film thicknesses of the SOG film on the first film thickness measurement wiring pattern are measured at a central part of the semiconductor wafer and at a peripheral portion of the semiconductor wafer located in a direction parallel to the first dicing line from the central part of the semiconductor wafer, and film thicknesses of the SOG film on the second film thickness measurement wiring pattern are measured at a central part of the semiconductor wafer and at a peripheral portion of the semiconductor wafer located in a direction parallel to the second dicing line from the central part of the semiconductor wafer.

* * * * *